United States Patent
Relleen et al.

(10) Patent No.: US 7,777,203 B2
(45) Date of Patent: Aug. 17, 2010

(54) SUBSTRATE HOLDING APPARATUS

(75) Inventors: Keith Relleen, Horsham (GB); Tristan Holtam, Horsham (GB)

(73) Assignee: Applied Materials, Inc., Santa Clara, CA (US)

( * ) Notice: Subject to any disclaimer, the term of this patent is extended or adjusted under 35 U.S.C. 154(b) by 955 days.

(21) Appl. No.: 11/527,724

(22) Filed: Sep. 27, 2006

(65) Prior Publication Data

US 2008/0073577 A1 Mar. 27, 2008

(51) Int. Cl.
*G21K 5/08* (2006.01)

(52) U.S. Cl. .............. 250/492.21; 250/492.1; 250/492.2; 250/492.3; 118/716; 118/723 R; 118/723 CB

(58) Field of Classification Search .............. 250/491.1, 250/492.1, 492.2, 492.21, 492.22, 492.3, 250/440.11, 441.11, 442.11, 400; 118/715, 118/716, 720, 723, 723 CB, 728, 729, 730, 118/731
See application file for complete search history.

(56) References Cited

U.S. PATENT DOCUMENTS

| | | | | |
|---|---|---|---|---|
| 5,224,809 A | * | 7/1993 | Maydan et al. | 414/217 |
| 6,315,512 B1 | * | 11/2001 | Tabrizi et al. | 414/217 |
| 6,555,825 B1 | | 4/2003 | Mitchell et al. | |
| 6,956,223 B2 | | 10/2005 | Smick et al. | |
| 2003/0192474 A1 | | 10/2003 | Smick et al. | |
| 2003/0197133 A1 | * | 10/2003 | Turner et al. | 250/492.21 |
| 2004/0191931 A1 | * | 9/2004 | Murrell et al. | 438/7 |
| 2005/0020077 A1 | * | 1/2005 | Zheng et al. | 438/689 |
| 2005/0173655 A1 | * | 8/2005 | Naylor-Smith et al. | 250/492.21 |
| 2006/0027763 A1 | * | 2/2006 | Deak | 250/492.21 |
| 2009/0191030 A1 | * | 7/2009 | Bluck et al. | 414/217 |

* cited by examiner

*Primary Examiner*—David A Vanore
*Assistant Examiner*—Nicole Ippolito Rausch
(74) *Attorney, Agent, or Firm*—Boult Wade Tennant

(57) ABSTRACT

A substrate holding apparatus for use in ion implanters includes two or more substrate holders that can adopt interchangeable positions, thereby allowing one substrate holder to scan a substrate through an ion beam while substrates can be swapped on the other substrate holder. The substrate holder assembly includes a base rotatable about a first axis and at least two support arms extending from the base to ends provided with substrate holders. Rotating the base allows the substrate holders to move between designated positions. One designated position may correspond to a position for implanting a substrate and another designated position may correspond to a loading/unloading station.

13 Claims, 4 Drawing Sheets

SUBSTRATE HOLDING APPARATUS

FIELD OF THE INVENTION

This invention relates to a substrate holding apparatus for use in ion implanters. In particular, the present invention relates to a substrate holding system comprising two or more substrate holders that can adopt interchangeable positions, thereby allowing one substrate holder to scan a substrate through an ion beam while substrates can be swapped on the other substrate holder.

BACKGROUND OF THE INVENTION

Although the present invention is not limited to the field of ion implanters, this field corresponds to a contemplated application and provides a useful context for understanding the invention. Hence there follows a description of ion implanters.

Ion implanters are well known and generally conform to a common design as follows. An ion source produces a mixed beam of ions from a precursor gas or the like. Only ions of a particular species are usually required for implantation in a substrate, for example a particular dopant for implantation in a semiconductor wafer. The required ions are selected from the mixed ion beam using a mass-analysing magnet in association with a mass-resolving slit. Hence, an ion beam containing almost exclusively the required ion species emerges from the mass-resolving slit to be transported to a process chamber where the ion beam is incident on a substrate held in place in the ion beam path by a substrate holder.

Often, the cross-sectional profile of the ion beam is smaller than the substrate to be implanted. For example, the ion beam may be a ribbon beam smaller than the substrate in one axial direction or a spot beam smaller than the substrate in both axial directions. In order to ensure ion implantation across the whole of the substrate, the ion beam and substrate are moved relative to one another such that the ion beam scans the entire substrate surface. This may be achieved by (a) deflecting the ion beam to scan across the substrate that is held in a fixed position, (b) mechanically moving the substrate whilst keeping the ion beam path fixed or (c) a combination of deflecting the ion beam and moving the substrate. For a spot beam, relative motion is generally effected such that the ion beam traces a raster pattern on the substrate.

Our U.S. Pat. No. 6,956,223 describes an ion implanter of the general design described above. A single wafer is held in a moveable substrate holder. While some steering of the ion beam is possible, the implanter is operated such that ion beam follows a fixed path during implantation. Instead, the wafer holder is moved along two orthogonal axes to cause the ion beam to scan over the wafer following a raster pattern.

The above design is particularly suitable for serial processing of wafers where a robot must unload a processed wafer before loading a new wafer to be implanted. Loading and unloading wafers between each implant causes an undesirable delay.

Our U.S. Pat. No. 6,555,825 describes an ion implanter having a twin scanning arm arrangement shown in FIG. 1. Each scanning arm has a motorised hub unit A that can rotate about an axis X1 between a scanning position shown on the right and a loading position shown on the left. A hollow arm B is rotatably mounted to the hub unit at one of its ends so as to be able to turn about axis X2 to effect scanning of a wafer through an ion beam. The other end of the arm is provided with a wafer holder C. Wafer holder C can rotate about axis X3 to allow the orientation of the wafer to be varied.

The construction and arrangement of each scanning arm is such that when the arm is in the loading position, it is above the axis X1 and therefore above the path of the ion beam D. This has particular significance because the wafer holder can be loaded and unloaded without any undesired effects due to the presence of the ion beam. At the same time, the hub unit can be rotated through 90° to convey the wafer holder to the scanning position where a wafer may be scanned through the path of the ion beam. As shown in dotted outline, the wafer may be moved on the arm from position P1 down through lower positions to position P2. In this ion implanter, a ribbon ion beam is used such that this movement sees the entire wafer implanted.

Provision of two such scanning arms allows one scanning arm to be used to scan a wafer while the other scanning arm may be positioned for concurrent loading and unloading of wafers. Hence, as soon as an implant is complete for one wafer, another wafer is ready for implant on the other scanning arm. Such a scanning arm arrangement is not capable of producing linear raster scans.

Another disadvantage of such radial scanning arrangements is the resultant non-uniform dose characteristics arising from differences in scan speed across the width of the wafer. This is because the closest edge of the wafer to the pivot scans more slowly than the outer edge, causing a higher dose on that side of the wafer.

SUMMARY OF THE INVENTION

Against this background, the present invention resides in a substrate holder assembly for holding substrates to be exposed to an ion beam during implantation in an ion implanter, the substrate holder assembly comprising a base rotatable about a first axis and at least two support arms extending from the base to ends provided with substrate holders. Rotation of the base allows the substrate holders to adopt designated positions, with the at least two support arms extending from points displaced from the axis of rotation by substantially equal distances and separated by a substantially equal separation angle such that rotation of the base through the separation angle causes the support arms to move between designated positions.

Thus, two or more sample holders may be provided that may be rotated to swap positions. For example, one position may correspond to a substrate scanning position and another position may correspond to a substrate loading/unloading position. Then, the substrate holder assembly may comprise a pair of support arms disposed on opposite sides of the axis of rotation of the base. When rotating the base between designated positions, one support arm moves from the scanning position to the loading position and the other support arm moves from the loading position to the scanning position.

More than two support arms may be used. For example, three support arms may be used, arranged with a separation of 120°, or four support arms may be used arranged 90° apart. Clearly, the provision of three support arms leads to three designated positions and, likewise, four support arms gives four designated positions. Various processes may be performed at each designated position, e.g. unloading a substrate, loading a substrate, both unloading and loading a substrate, implanting, cleaning, etching, annealing, deposition, etc. One or more designated positions may not have associated processes, i.e. the substrate may merely be parked at this position while other substrates are processed at one or more other designated positions.

Preferably, the substrate holders are each provided with a support surface for supporting the substrate aligned substantially normal to the support arm's longitudinal axis, and the at least two support arms are rotatable about their longitudinal axes. Optionally, the support surface is rotatable about its centre axis. This allows the orientation of a substrate held by the substrate holder to be varied.

Preferably, the at least two support arms are moveable along their longitudinal axes such that the distance of each substrate holder from the base may be varied. This allows a substrate to be moved into and out of a beam, and to be scanned through an ion beam in this direction.

The present invention also resides in an ion implanter comprising an ion source, optics operable to guide ions produced by the ion source along an ion beam path to a process chamber for implantation in a substrate, a substrate transfer mechanism, and a substrate holder assembly as described above to hold substrates in the process chamber. The at least two support arms extend substantially normal to the ion beam path. A first of the designated positions corresponds to the substrate holder being disposed to face into the ion beam. A second of the designated positions corresponds to the substrate holder being disposed to be clear of the ion beam path and to co-operate with the substrate transfer mechanism thereby allowing substrates to be placed on and removed from the substrate holder.

Preferably, the at least two support arms are moveable along their longitudinal axes such that the distance of each substrate holder from the base may be varied. Optionally, the base may have an associated scanning unit that is operable to scan the support arm back and forth along its longitudinal axis. Also, the scanning unit may be operable to scan the support arm in a direction substantially normal to both the longitudinal axis of the support arm and the ion beam path. This allows a substrate to be scanned relative to a fixed ion beam, for example according to a raster pattern. Alternatively, the substrate may be held in position while an ion beam is scanned across the substrate or a hybrid system may be used where both substrate and ion beam are moved.

BRIEF DESCRIPTION OF THE DRAWINGS

In order that the present invention may be better understood, a preferred embodiment will now be described with reference to the accompanying drawings, in which.

DETAILED DESCRIPTION OF THE INVENTION

Figure 1:
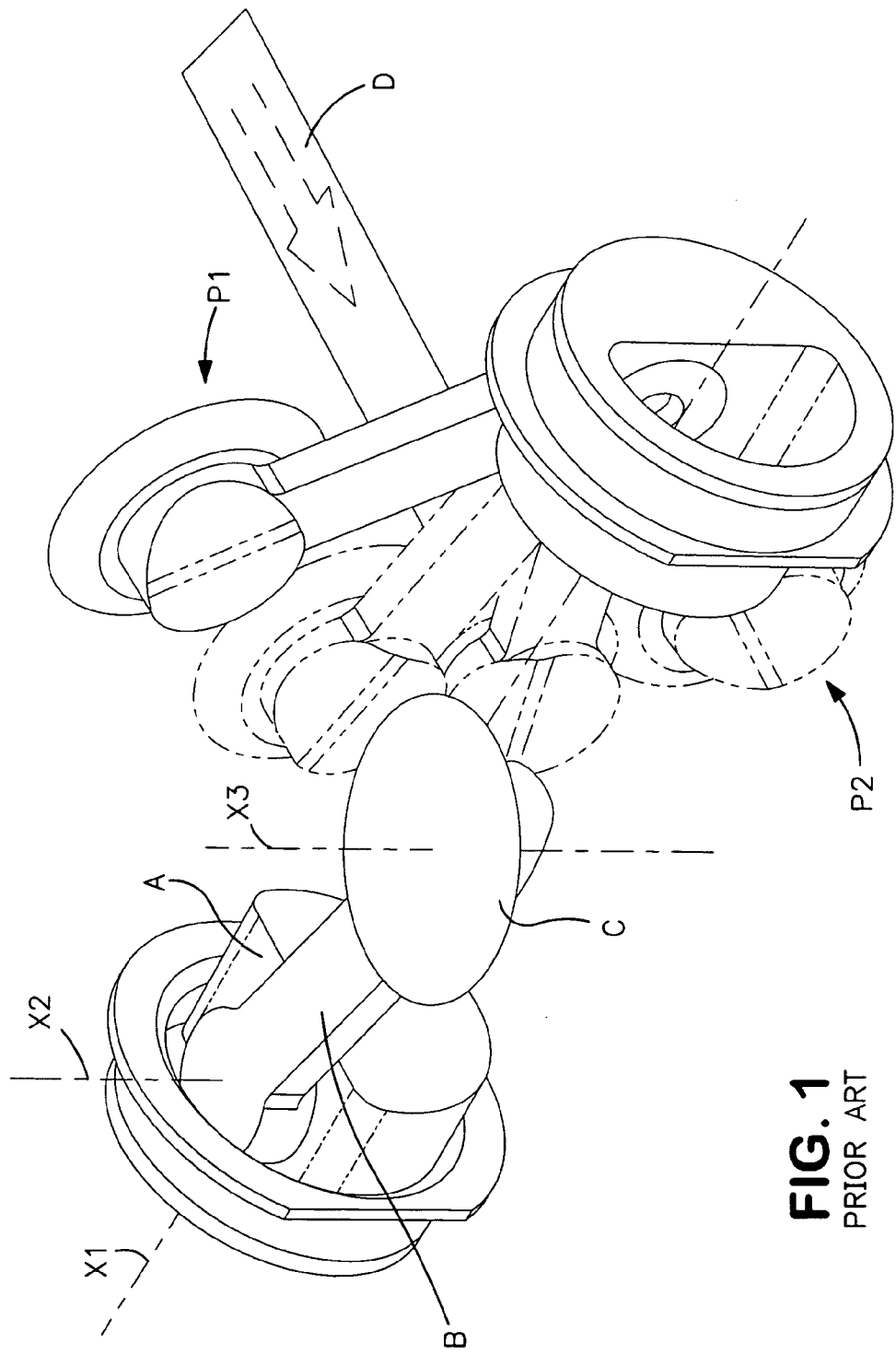
FIG. 1 is a perspective view of a twin scanning arm apparatus according to the prior art.
Figure 2:
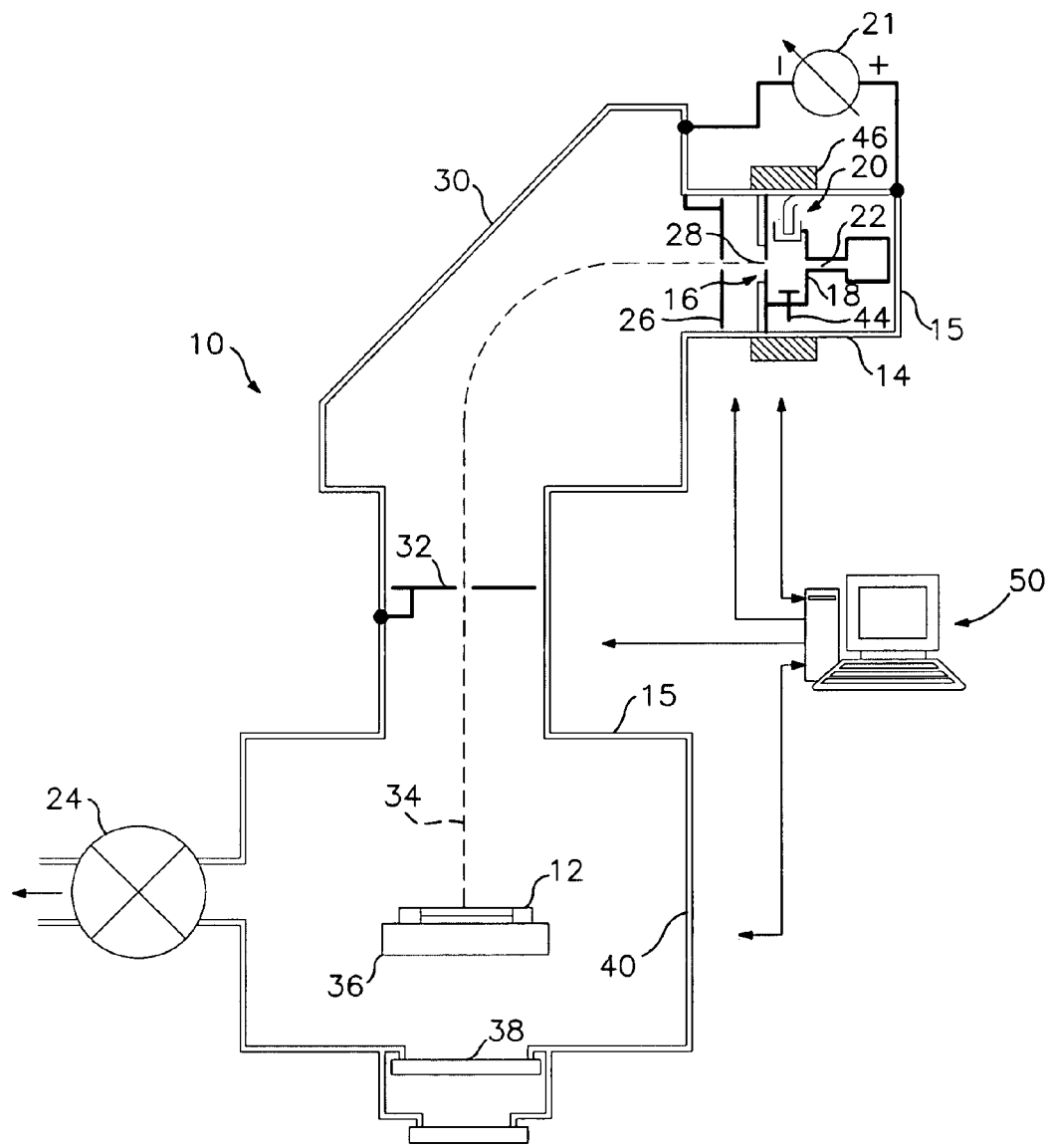
FIG. 2 is a schematic representation of a conventional ion implanter.

In order to provide a context for the present invention, an exemplary application is shown in FIG. 2, although it will be appreciated that this is merely an example of an application of the present invention and is in no way limiting.

FIG. 2 shows a known ion implanter 10 for implanting ions in semiconductor wafers 12. Ions are generated by the ion source 14 to be extracted and follow an ion path 34 that passes, in this embodiment, through a mass analysis stage 30. Ions of a desired mass are selected to pass through a mass-resolving slit 32 and then to strike the semiconductor wafer 12.

The ion implanter 10 contains an ion source 14 for generating an ion beam of a desired species that is located within a vacuum chamber 15 evacuated by pump 24. The ion source 14 generally comprises an arc chamber 16 containing a cathode 20 located at one end thereof. The ion source 14 may be operated such that an anode is provided by the walls 18 of the arc chamber 16. The cathode 20 is heated sufficiently to generate thermal electrons.

Thermal electrons emitted by the cathode 20 are attracted to the anode, the adjacent chamber walls 18 in this case. The thermal electrons ionise gas molecules as they traverse the arc chamber 16, thereby forming a plasma and generating the desired ions.

The path followed by the thermal electrons may be controlled to prevent the electrons merely following the shortest path to the chamber walls 18. A magnet assembly 46 provides a magnetic field extending through the arc chamber 16 such that thermal electrons follow a spiral path along the length of the arc chamber 16 towards a counter-cathode 44 located at the opposite end of the arc chamber 16.

A gas feed 22 fills the arc chamber 16 with the species to be implanted or with a precursor gas species. The arc chamber 16 is held at a reduced pressure within the vacuum chamber 15. The thermal electrons travelling through the arc chamber 16 ionise the gas molecules present in the arc chamber 16 and may also crack molecules. The ions (that may comprise a mixture of ions) created in the plasma will also contain trace amounts of contaminant ions (e.g. generated from the material of the chamber walls 18).

Ions from within the arc chamber 16 are extracted through an exit aperture 28 provided in a front plate of the arc chamber 16 using a negatively-biased (relative to ground) extraction electrode 26. A potential difference is applied between the ion source 14 and the following mass analysis stage 30 by a power supply 21 to accelerate extracted ions, the ion source 14 and mass analysis stage 30 being electrically isolated from each other by an insulator (riot shown). The mixture of extracted ions are then passed through the mass analysis stage 30 so that they pass around a curved path under the influence of a magnetic field. The radius of curvature travelled by any ion is determined by its mass, charge state and energy, and the magnetic field is controlled so that, for a set beam energy, only those ions with a desired mass to charge ratio and energy exit along a path coincident with the mass-resolving slit 32. The emergent ion beam is then transported to the process chamber 40 where the target is located, i.e. the substrate wafer 12 to be implanted or a beam stop 38 when there is no wafer 12 in the target position. In other modes, the beam may also be accelerated or decelerated using a lens assembly positioned between the mass analysis stage 30 and the wafer position.

The semiconductor wafer 12 is mounted on a wafer holder 36, wafers 12 being successively transferred to and from the wafer holder 36, for example through a load lock (not shown).

The ion implanter 10 operates under the management of a controller, such as a suitably programmed computer 50. The computer 50 controls scanning of the wafer 12 through the ion beam 34 to effect desired scanning patterns. These scanning patterns may comprise raster scans, including interlaced patterns, as is well known in the art.

Figure 3:
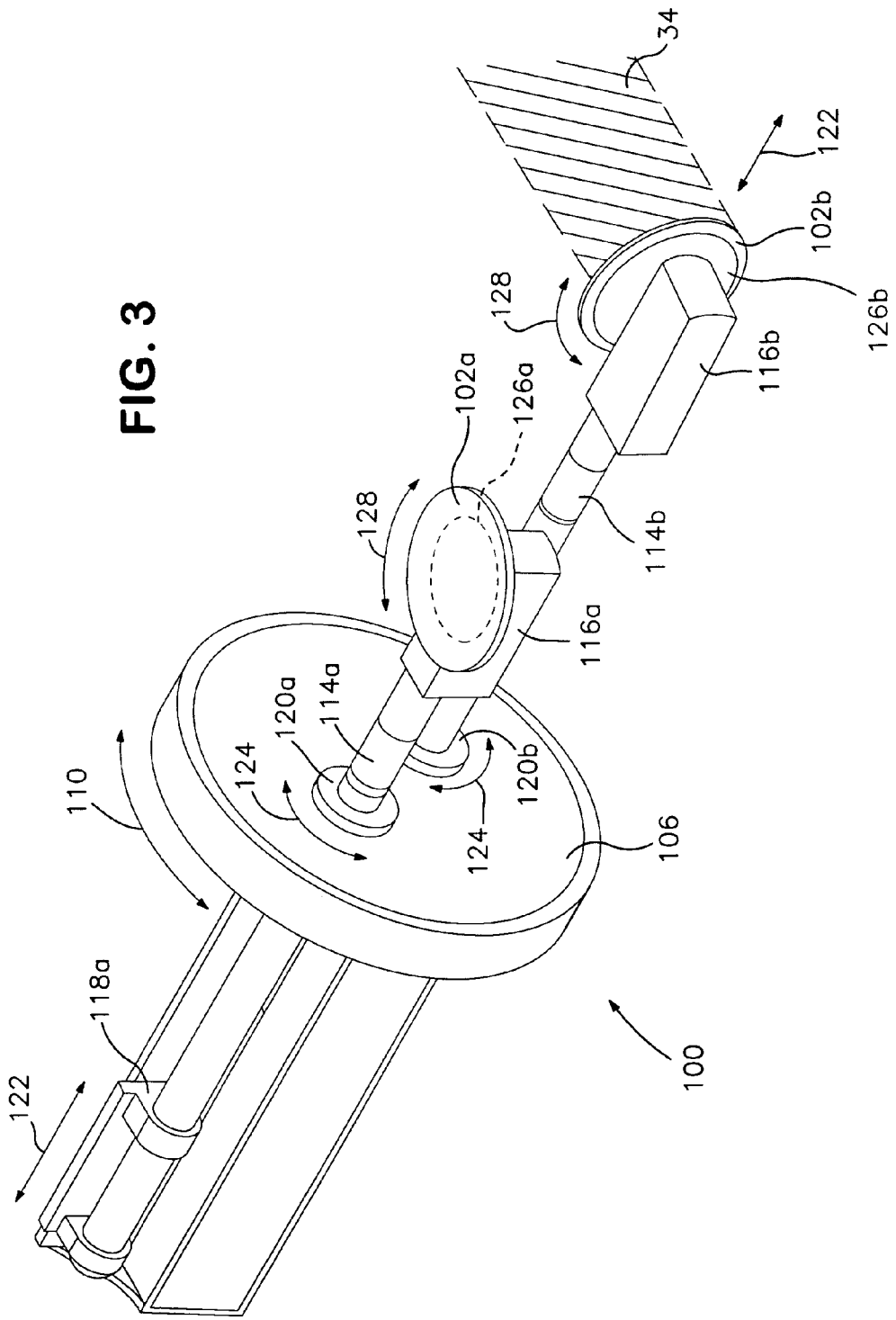
FIG. 3 is a perspective view of a substrate holder assembly according to an embodiment of the present invention.
Figure 4:
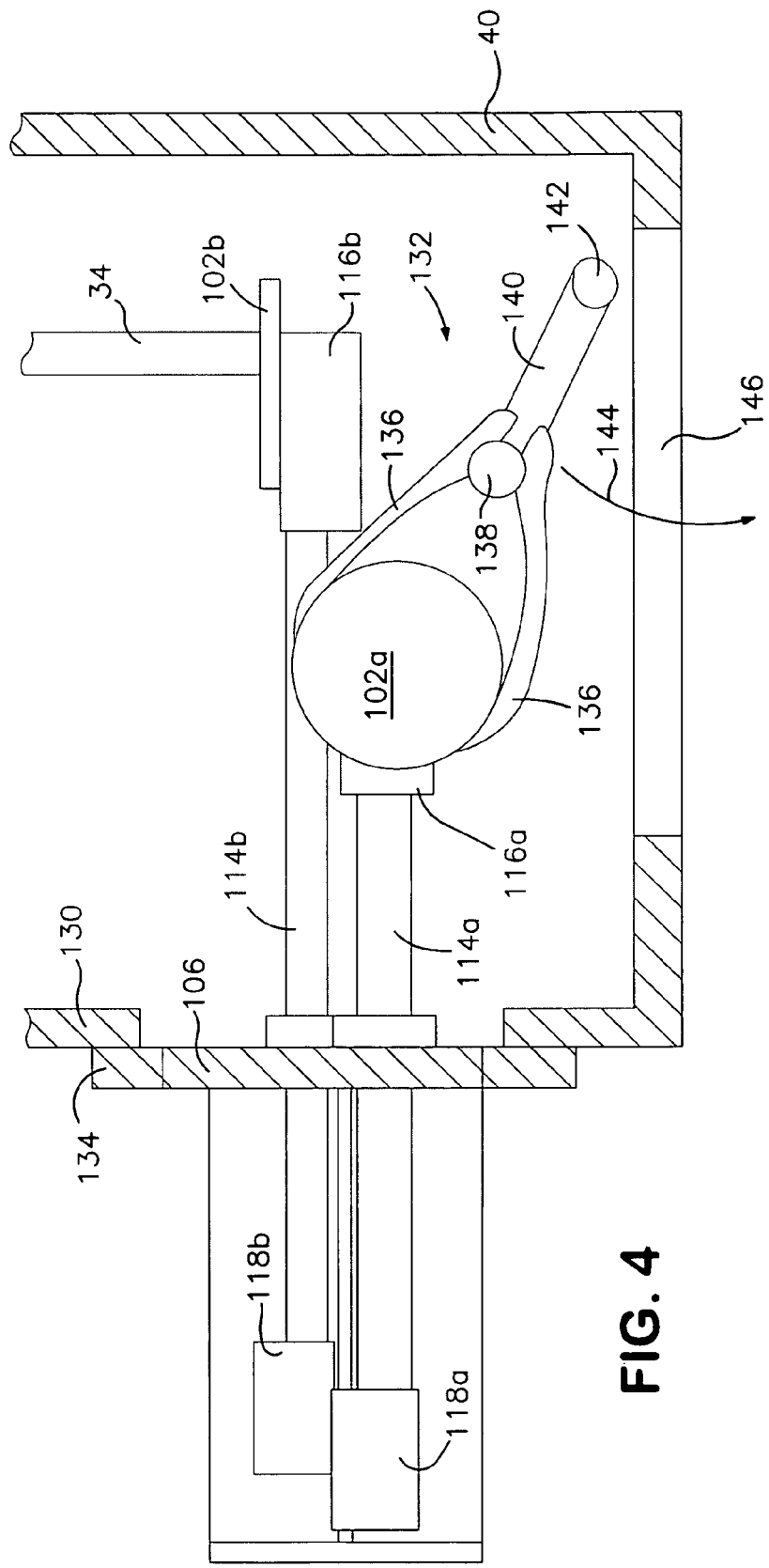
FIG. 4 is a section taken through the process chamber containing the substrate holder assembly of FIG. 3.

FIG. 3 shows apparatus 100 for holding two wafers 102a,b in an ion implanter 10 like the one shown in FIG. 2. FIG. 4 shows the apparatus 100 in position in a process chamber 40, its sectional view corresponding to a section taken a little above the plane of the ion beam 34. As will be appreciated, the apparatus 100 is mounted to a wall 130 of the process chamber 40 and is used either to hold a wafer 102a,b in position while the ion beam 34 is scanned or to scan a wafer 102a,b through an ion beam 34. The apparatus 100 also cooperates with a robot 132 during loading and unloading of wafers 102a,b.

The apparatus 100 comprises a turntable 106 that mates with a rotary actuator 134 that provides full range of rotation of the turntable 106 in the direction indicated by arrow 110. The turntable 106 is supported by a crossed-roller bearing and sealing is provided by floating air bearing labyrinth seal units with differential pumping. The rotary actuator 134 has an associated flange for mounting the apparatus to the process chamber 40.

Two scanning arms 114a,b are provided, each with a wafer holder 116a,b at its end. Each scanning arm 114a,b extends from its wafer holder 116a,b back towards the supporting turntable 106, and in fact extends through the turntable 106 to be received by a linear actuator 118a,b that is mounted to the rear of the turntable 106. The scanning arms 114a,b are supported at the turntable 106 by sealed bushings 120a,b that allow the scanning arms 114a,b to be driven through the turntable 106 by the linear actuator 118a,b. In this way, the distance of the wafer holder 116a,b from the turntable 106 can be varied, i.e. the wafer 102a,b can be driven into and out of the process chamber in the direction indicated by arrow 122.

In addition to driving the scanning arm 114a,b into and out of the process chamber 40, the linear actuator 118a,b also drives rotary motion of the scanning arm 114a,b such that it rotates about its longitudinal axis as indicated by the arrow 124.

Each scanning arm 114a,b is hollow so as to provide routing for services to the wafer holder 116a,b. This includes a drive mechanism that allows a chuck 126a,b that supports the wafer 102a,b to be rotated about its centre, as indicated by arrow 128. The chuck 126a,b holds the wafer 102a,b firmly in place electrostatically, such that rotation of the chuck 126a,b causes corresponding rotation of the wafer 102a,b. Other methods of mounting the wafer 102a,b to the chuck 126a,b are equally possible.

FIGS. 3 and 4 show the apparatus 100 with turntable 106 set so that wafer holder 116a occupies the loading position while wafer holder 116b occupies the scanning position. Rotating the turntable 106 through 180° swaps the positions occupied by the wafer holders 116a,b.

In the loading position, the scanning arm 114a is rotated about direction 124 to ensure that the wafer 102a faces upwards. The electrostatic force holding wafer 102a to the chuck 126a can be interrupted and the wafer 102a removed from the chuck 126a by the robot 132. A simple robot 132 is shown in FIG. 4 that comprises a pair of hinged jaws 136 that can open and close by rotation of cam 138. Jaws 136 and cam 138 are cantilevered on an arm 140 that is mounted to shaft 142. Shaft 142 allows vertical movement (i.e. in and out of the plane of the paper) and rotation as indicated by arrow 144. Thus, the robot 132 may be rotated such that jaws 136 move over wafer 102a, the jaws 136 may be lowered on shaft 142 and closed to grip the wafer 102a. The robot 132 may then be raised on shaft 142 and subsequently rotated in direction 144 such that the wafer 102a in jaws 136 swings out of the process chamber 40 through gate valve 146. Due to vacuum considerations, a load lock is preferable to the single gate valve 146 shown in FIG. 4. The reverse procedure may then be used to load a new wafer 102a onto wafer holder 126a. As will be apparent to those skilled in the art, many other alternative robot arrangements may be used to load and unload wafers.

Once a new wafer 102a is loaded onto the chuck 126a and held in place by electrostatic force, it is ready for the scanning arm 114a to be rotated. As will be appreciated from FIG. 3, the loading position sees the wafer 102a held away from the ion beam path 34. The scanning arm 114a holds the wafer 102a above the level of the ion beam path 34 and also the scanning arm 114a is retracted towards the turntable 106 along direction 122 thereby moving the wafer 102a back from the ion beam path 34.

In the scanning position, the scanning arm 114b is extended away from the turntable 106 in direction 122 and is rotated in direction 124 such that the wafer 102b is held upright to face the incoming ion beam 34. In some applications, it will be preferable for the ion beam 34 to strike the wafer 102b at an angle rather than perpendicularly, for example when implanting trench walls or when using grazing angles to achieve shallower implants. This is easily accomplished by rotating the scanning arm 114b in the direction 124 such that the wafer 102b adopts the desired angle to the ion beam 34. In addition, the chuck 126b can be rotated about direction 128 to achieve a desired orientation of the wafer 102b. In this way, features on the wafer 102b such as trench walls can be correctly aligned with the ion beam 34.

In this embodiment, the wafer 102b is held in the scanning position while a ribbon beam 34 is scanned across the static wafer 102b. However, other arrangements are possible. For example, a ribbon beam need not be used, and a spot beam may be scanned across the wafer 102b using a raster pattern for example. Also, the wafer 102b may be scanned in addition to or as an alternative to scanning the ion beam 34. Scanning in the x direction (taken to be the horizontal here) is readily achieved using the linear actuator 118a to drive the scanning arm 114b back and forth in the x direction.

To move wafer holders 116a,b between the loading and scanning positions, three movements are required: (1) the turntable must be rotated through 180° about direction 110, either clockwise or anticlockwise as desired; (2) scanning arms 114a,b must be rotated through 90° about direction 124, scanning arm 114a in an anticlockwise direction and scanning arm 114b in a clockwise direction; and (3) scanning arms 114a,b must be moved along direction 122, scanning arm 114a into the process chamber 40 away from the turntable 106 and scanning arm 114b towards the turntable 106. Generally, these movements will be effected by the controller 50, but how it coordinates these three different movements is a matter of preference. Clearly, it is advantageous to effect the movements concurrently to avoid delay and maximise throughput of wafers 102a,b through the ion implanter 10. The scanning arms 114a,b are separated sufficiently to ensure that the wafers 102a,b cannot collide as they are rotated during movement between loading and scanning positions, even when larger 300 mm wafers are being processed.

The skilled person will appreciate that changes may be made to the above-described embodiment without departing from the scope of the present invention.

For example, the above embodiment exemplifies the present invention for use in the field of implanting semiconductor wafers. However, the present invention enjoys far wider applicability. For example, the present invention may be used in any type of ion implanter, whether that be for implanting semiconductor wafers or any other type of substrate. Also, the present invention may be used in any other type of apparatus that requires workpiece manipulation, where workpieces are rotated between a number of designated positions.

The above embodiment describes a twin scanning arm apparatus 100. However, three or more scanning arms 114a,b may be used. Advantageously, the scanning arms 114a,b are equally spaced from the centre of rotation of the turntable such that the wafer holders 116a,b adopt the same position as they are moved between positions. Also, it is advantageous for the scanning arms 114a,b to be separated by substantially equal angles such that the scanning arms 114a,b merely rotate between successive positions. Each position may correspond to a station where a processing step is performed, e.g. implanting, loading/unloading, etching, annealing, deposition, cleaning, etc. Loading and unloading may be split into two separate actions performed at separate stations, i.e. a wafer 102a,b or other substrate is unloaded at a station before a new wafer 102a,b or other substrate is loaded at the next station. One or more positions may be idle positions where the wafer 102a,b or other substrate dwells before moving on to the next position. An idle station may be useful where limited space precludes the installation of processing apparatus adjacent that position.

The embodiment of the present invention described above enjoys many degrees of movement to provide a flexible system. However, the apparatus 100 need not be provided with such capability. For example, an apparatus 100 enjoying only rotation about direction 110 to allow the scanning arms 114a,b to swap positions is possible. The loading robot would need to be adapted to load and unload wafers 102a,b from a vertical orientation, but such adaptation is straightforward. Scanning arms 114a,b need not be mobile in direction 122, i.e. towards and away from the turntable 106, because the wafer 102a,b is rotated clear of the ion beam 34.

While FIG. 3 shows the scanning arms 114a,b to extend through the turntable 106, telescopic arms may be provided that do not need to penetrate the turntable 106.

The invention claimed is:

1. A substrate holder assembly for holding substrates to be exposed to an ion beam during implantation in an ion implanter, the substrate holder assembly comprising:
  a base rotatable about a first axis of rotation;
  at least two support arms extending substantially in parallel with said first axis of rotation from the base to ends provided with substrate holders;
  wherein rotation of the base allows the substrate holders to adopt designated positions, with the at least two support arms extending from points on the base displaced from the first axis of rotation by substantially equal distances and separated by a substantially equal separation angle such that rotation of the base through the separation angle causes the support arms to move between designated positions.

2. The substrate holder assembly of claim 1, wherein the at least two support arms are rotatable about their longitudinal axes.

3. The substrate holder assembly of claim 1, wherein the substrate holders are each provided with a support surface for supporting the substrate, the support surface being rotatable about its centre axis.

4. The substrate holder assembly of claim 3, wherein the support surface's centre axis is substantially normal to the support arm's longitudinal axis.

5. The substrate holder assembly of claim 1, wherein the at least two support arms are moveable along their longitudinal axes such that the distance of each substrate holder from the base may be varied.

6. An ion implanter comprising an ion source, optics operable to guide ions produced by the ion source along an ion beam path to a process chamber for implantation in a substrate, a substrate transfer mechanism, and the substrate holder assembly of claim 1 positioned to hold substrates in the process chamber such that the at least two support arms extend substantially normal to the ion beam path; and wherein a first of the designated positions corresponds to the substrate holder being disposed to face into the ion beam, and a second of the designated positions corresponds to the substrate holder being disposed to be clear of the ion beam path and to co-operate with the substrate transfer mechanism thereby allowing substrates to be placed on and removed from the substrate holder.

7. The ion implanter of claim 6, wherein the at least two support arms are rotatable about their longitudinal axes.

8. The ion implanter of claim 6, wherein the substrate holders are each provided with a support surface for supporting the substrate, the support surface being rotatable about its centre axis.

9. The ion implanter of claim 8, wherein the support surface's centre axis is substantially normal to the support arm's longitudinal axis.

10. The ion implanter of claim 6, wherein the at least two support arms are moveable along their longitudinal axes such that the distance of each substrate holder from the base may be varied.

11. The ion implanter of claim 10, wherein the base has an associated scanning unit that is operable to scan the support arm back and forth along its longitudinal axis.

12. The ion implanter of claim 11, wherein the scanning unit is operable to scan the support arm in a direction substantially normal to both the longitudinal axis of the support arm and the ion beam path.

13. The ion implanter of claim 12, wherein the scanning unit is operable to scan the support arm such that the ion beam traces a raster pattern across a substrate when held by the substrate holder.

* * * * *